(12) United States Patent
Bargauan

(10) Patent No.: US 7,519,141 B2
(45) Date of Patent: Apr. 14, 2009

(54) METHOD FOR CONVERTING A REAL SIGNAL INTO A COMPLEX SIGNAL

(75) Inventor: Michele Bargauan, Milan (IT)

(73) Assignee: M.B. International Telecom Cabs S.R.L., Brescia (IT)

( * ) Notice: Subject to any disclaimer, the term of this patent is extended or adjusted under 35 U.S.C. 154(b) by 137 days.

(21) Appl. No.: 09/775,492

(22) Filed: Feb. 5, 2001

(65) Prior Publication Data
US 2001/0028688 A1    Oct. 11, 2001

(30) Foreign Application Priority Data
Mar. 24, 2000    (IT) .......................... MI2000A0636

(51) Int. Cl.
H04L 23/00    (2006.01)
(52) U.S. Cl. ..................................... 375/377
(58) Field of Classification Search ................... 331/38; 375/334, 377, 235; 455/76, 73; 341/143, 341/155; 348/724
See application file for complete search history.

(56) References Cited

U.S. PATENT DOCUMENTS

| | | | | |
|---|---|---|---|---|
| 3,852,746 A | * | 12/1974 | Lowenschuss et al. | 342/201 |
| 3,878,476 A | * | 4/1975 | Honore et al. | 331/38 |
| 5,113,189 A | * | 5/1992 | Messer et al. | 341/143 |
| 5,822,020 A | * | 10/1998 | Bargauan | 348/724 |
| 5,894,499 A | * | 4/1999 | Katayama et al. | 375/334 |
| 5,970,128 A | * | 10/1999 | Kim | 379/142.01 |
| 6,374,086 B1 | * | 4/2002 | Tolson | 455/73 |
| 6,466,277 B1 | * | 10/2002 | McNeely | 348/724 |
| 6,574,458 B1 | * | 6/2003 | Bargauan | 332/103 |
| 6,622,009 B1 | * | 9/2003 | Tolson | 455/76 |
| 6,680,971 B1 | * | 1/2004 | Tazebay et al. | 375/235 |
| 6,687,313 B1 | * | 2/2004 | Limberg | 375/321 |

\* cited by examiner

*Primary Examiner*—Don N Vo
(74) *Attorney, Agent, or Firm*—Modiano & Associati; Albert Josif; Daniel J. O'Byrne

(57) ABSTRACT

A method for converting a real signal into a complex signal in quadrature, whose particularity consists of the fact that it comprises the step that consists in adding to a real signal meant to be converted into a complex signal a signal whose frequency is four times the band-center frequency of the signal to be converted, in order to obtain a quadrature. The method further comprises the steps of: after the adding step from which a sum signal is obtained, selecting, from the sum signal, a first component and a second component which are in phase and in quadrature;

removing components below a given level from the first and second components in phrase and in quadrature, in order to obtain a first and a second signal component at DC zero level.

13 Claims, 3 Drawing Sheets

METHOD FOR CONVERTING A REAL SIGNAL INTO A COMPLEX SIGNAL

BACKGROUND OF THE INVENTION

The present invention relates to a method for converting a real signal into a complex signal, so that the in-phase and quadrature components are inherently in quadrature.

It is known that real/complex converters, also known as IQ demodulators, used to convert a pass-band signal into a baseband signal in order to allow its subsequent digital processing, and synchronous receivers, also known as ZERO-IF receivers, use a conversion of a real signal into a complex signal.

This process of conversion from pass-band to baseband is achieved by multiplying the input signal with a complex carrier whose frequency is equal to the center frequency.

In this regard, FIG. 1 illustrates the input signal, designated by the reference numeral 1, which is introduced in multiplier means 2 and 3 being designed to respectively multiply the input signal 1 with a complex carrier whose frequency is equal to the center frequency.

The reference numeral 4 designates an oscillator whose frequency is equal to the center frequency and the reference numerals 5 and 6 respectively designate the complex component (sine) and the real component (cosine) of the carrier. The input signal 1 is then multiplied in the multiplier 2 with the imaginary or complex component 5 of the carrier (sine component) and, in the multiplier 3, with the real component 6 of the carrier (cosine).

However, the generation of the real component (cosine) and imaginary component (sine) of the carrier, although conceptually simple, raises great problems in terms of implementation.

In particular, it is almost impossible to achieve high precision in the phase ratio, which should be 90 degrees.

In practice, errors of even one or two degrees are absolutely common, when instead a good conversion should contain the errors within a few millionths of a degree.

Phase errors in conversion produce important distortions of the signal and/or of the information carried by the signal, as in the case of FM modulation and ZERO-IF receivers.

SUMMARY OF THE INVENTION

The aim of the present invention is to provide a method for converting a real signal into a complex signal so that the in-phase and quadrature components are inherently in perfect quadrature even in the presence of imprecisions in the conversion signals.

Within the scope of this aim, an object of the present invention is to provide a method for converting a real signal into a complex signal which is highly reliable, relatively simple to provide and at competitive costs.

This aim and other objects which will become better apparent hereinafter are achieved by a method for converting a real signal into a complex signal inherently in quadrature, comprising the step of:

adding to a real signal designed to be converted into a complex signal a signal whose frequency is four times the band-center frequency of said signal to be converted, in order to obtain an inherent quadrature.

These and other objects are also achieved by a device for converting a real signal into a complex signal, characterized in that it comprises first adder means which are suitable to add a signal to be converted and a signal whose frequency is four times the central frequency of said signal to be converted.

BRIEF DESCRIPTION OF THE DRAWINGS

Further characteristics and advantages of the invention will become better apparent from the description of preferred but not exclusive embodiments of the method according to the invention, illustrated only by way of non-limitative example in the accompanying drawings, wherein.

DESCRIPTION OF THE PREFERRED EMBODIMENTS

Figure 1:
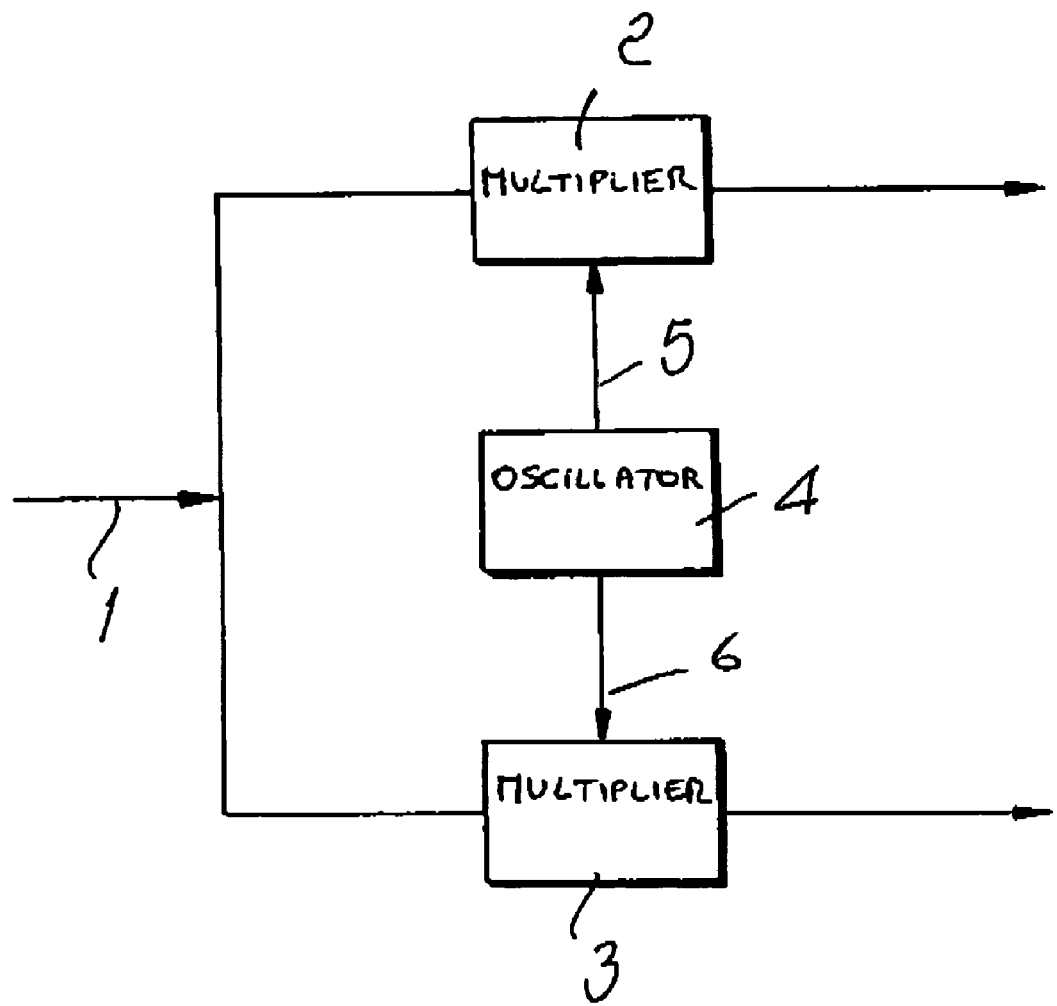
FIG. 1 is a block diagram of a conventional method for converting a real signal into a complex signal.

With reference to the figures, and initially to FIG. 1, the method according to the present invention comprises a first step in which a signal 1 (the signal to be converted 1 is designated by the same reference numeral used in FIG. 1) to be converted is added, in adder means 6, to a signal whose frequency is four times the band-center frequency of the signal 1.

The reference numeral 7 designates oscillator means which are suitable to generate the signal whose frequency is four times the band-center frequency of the signal to be converted 1. The main feature of the invention is indeed that an inherent quadrature is obtained by adding a signal whose frequency is four times the band-center frequency of the signal to be converted.

At this point, the resulting sum signal, designated by the reference numeral 9 (sum signal), is sent to selector means 8, which alternately send the signal 9 for a period equal to twice the band-center frequency of the signal to be converted 1 on a branch I, while on the opposite branch Q there is a zero signal, and for a period on the branch Q (with the zero signal on the branch I) with a frequency equal to twice the band-center frequency of the signal to be converted 1.

The selection means 8 conveniently comprise a selector 10 and an oscillator 11 adapted to generate a square wave whose frequency is twice the band-center frequency of the signal to be converted 1.

The signal generated by the oscillator 11 is only approximately in phase with the signal generated by the oscillator 7.

The signals input on the branches I and Q are then sent to two threshold circuits, one for the branch I, designated by the reference numeral 12, and one for the branch Q, designated by the reference numeral 13.

The threshold circuits remove all the components below a certain level and bring the signal to the DC zero level.

The signal components in output from the threshold circuits 12 and 13 are then sent to respective multiplier circuits 14 and 15, which multiply the signal by 1 and −1 at a frequency equal to the center frequency of the signal to be converted 1, generated by means of an oscillator 16.

The output signals are therefore the components I and Q of the signal to be converted 1, in quadrature with each other.

It should be noted that the multipliers 14 and 15 differ from the multipliers 2 and 3 shown in FIG. 1 in that the multipliers according to the invention are multipliers which are suitable to multiply with a square wave and not with sine and cosine components as in the known method shown in FIG. 1.

Moreover, the phase of the square-wave signal generated by the oscillator 16 is only approximately equal to the phase of the signal generated by the oscillator 7.

The signal generated by the oscillator 7 is a sinusoidal signal whose frequency is, as mentioned, four times the band-center frequency of the signal to be converted 1.

Figure 2:
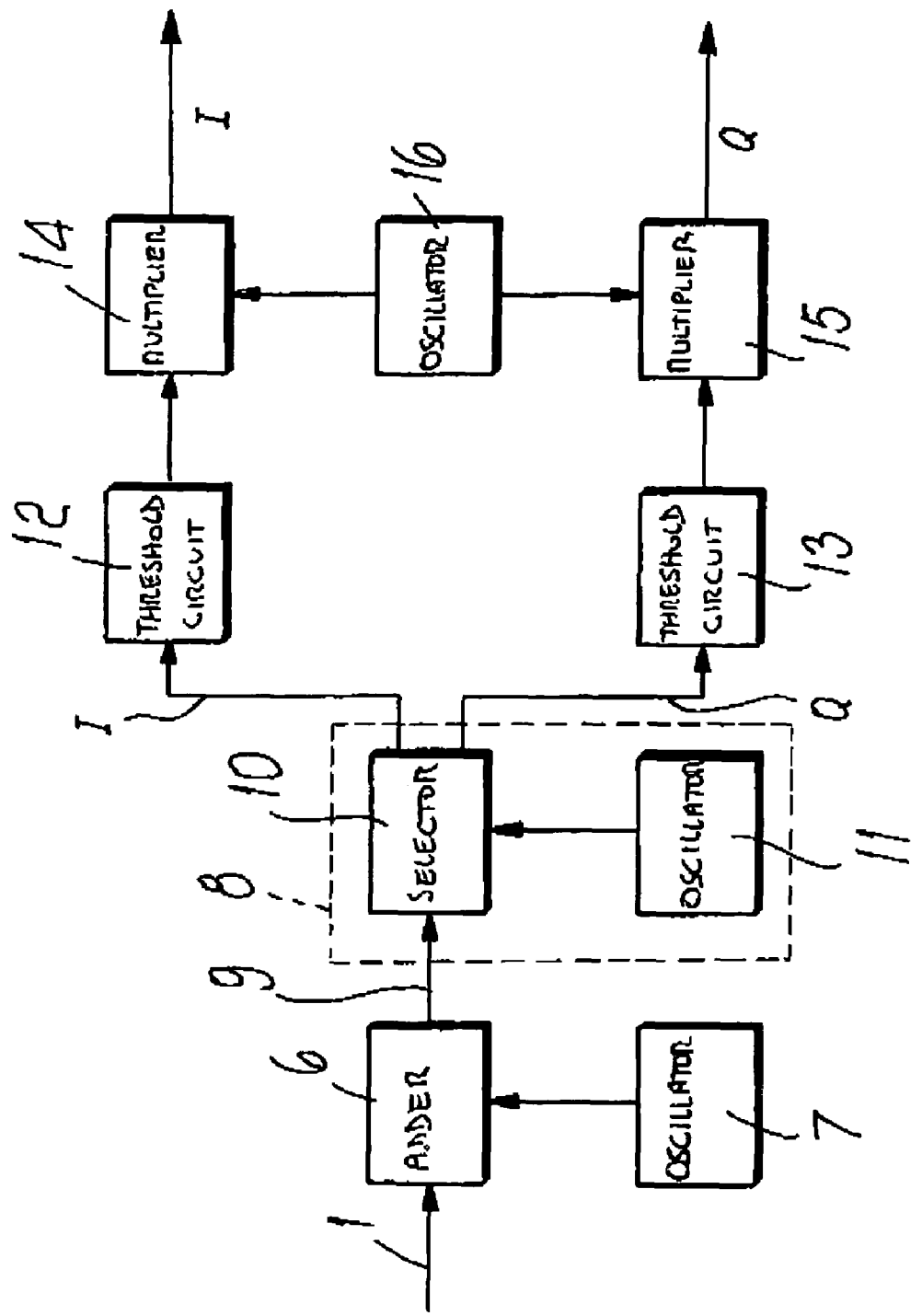
FIG. 2 is a block diagram of a first embodiment of the method for converting a real signal into a complex signal, according to the present invention.
Figure 3:
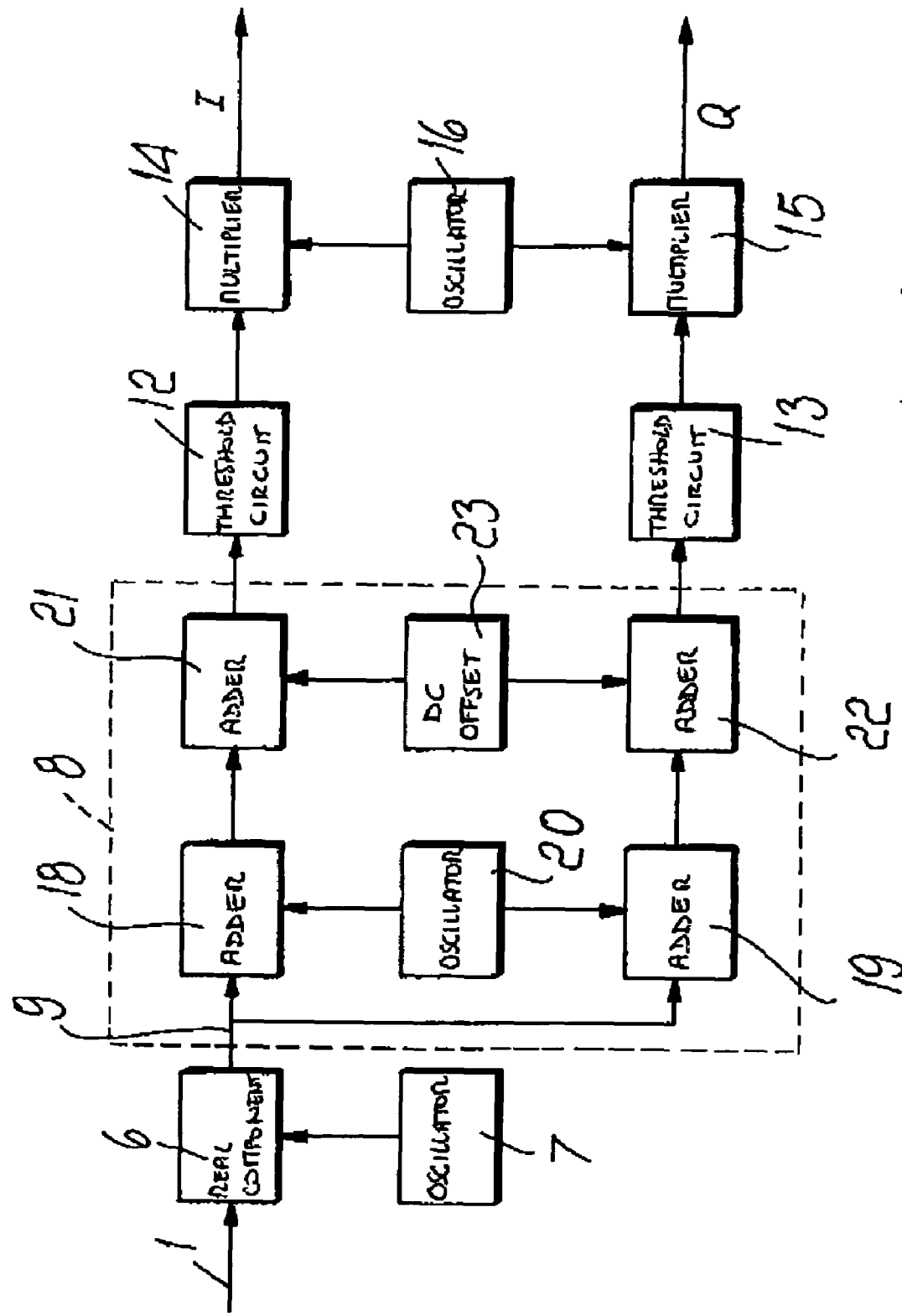
FIG. 3 is a block diagram of a second embodiment of the method for converting a real signal into a complex signal, according to the present invention.

FIG. 3 illustrates a second embodiment of the method according to the invention, wherein the selection means 8 are provided so that the selector 10 of FIG. 2 is now provided by a pair of adders 18 and 19 in which the signal 9 in output from the adder means 6 receives the addition of a square-wave signal generated by an oscillator 20 with a frequency which is twice the frequency 3 of the signal to be converted 1.

The square-wave signal generated by the oscillator 20 is added, respectively in normal form and in inverted form, in the adders 18 and 19.

The threshold circuits 12 and 13 arranged in cascade to the selection means 8 furthermore remove part of the signal, as in the block: diagram of FIG. 2, but the signals in output from the adders 18 and 19 are first input to additional adders 21 and 22 in which a DC offset 23 is added to the components of the signal so as to avoid removing the DC component at the level of the threshold circuits 12 and 13.

In practice, the method according to the invention allows to generate the real and imaginary components of the signal to be converted, so as to avoid the need to generate real and imaginary components of the carrier with which the signal to be converted is multiplied in conventional methods.

In this manner, the exact phase relation between the real component and the imaginary component of the carrier, which should be exactly 90 degrees, is no longer a problem, and even variations from this ideal phase relation do not entail significant distortions of the signal and/or of the information carried by the signal to be converted 1.

In practice it has been observed that the method according to the invention fully achieves the intended aim and object, since it allows to convert a real signal into a complex signal inherently in quadrature, without having to have signals with phases in very specific relations to each other.

The method thus conceived is susceptible of numerous modifications and variations, all of which are within the scope of the inventive concept; all the details may furthermore be replaced with other technically equivalent elements.

The disclosures in Italian Patent Application No. MI2000A000636 from which this application claims priority are incorporated herein by reference.

What is claimed is:

1. A method for converting a real signal into a complex signal inherently in quadrature, comprising the step of:
   starting from a real signal to be converted,
   adding to said real signal, designed to be converted into a complex signal, a signal whose frequency is four times the band-center frequency of said real signal to be converted;
   selecting, from said sum signal, a first component and a second component which are in phase and in quadrature;
   removing components below a given level from said first and second components in phase and in quadrature, in order to obtain a first and a second signal component at DC zero level, said removing step being performed by threshold circuits;
   multiplying said DC zero level components respectively by 1 and −1, with a frequency equal to the center frequency of said signal to be converted in input, obtaining a complex signal with an inherent quadrature,
   wherein said selection step is performed by selection means, which send signals to said threshold circuits with a frequency which is twice said band-center frequency of the signal to be converted.

2. The method according to claim 1, wherein said selection means comprise at least one selector and an oscillator adapted to generate a square-wave signal whose frequency is equal to twice the band-center frequency of said signal to be converted.

3. The method according to claim 2, wherein the square-wave signal generated by said oscillator included in said selector is only approximately in phase with said signal whose frequency is four times said center frequency of the signal to be converted 4. The method according to claim 3, wherein a multiplier is adapted to multiply said phase and quadrature components by a square-wave signal whose frequency is equal to said center frequency of the signal to be converted.

5. The method according to claim 4, wherein said square-wave signal generated by said oscillator is sent to said multiplier and is only approximately in phase with said signal whose frequency is four times said center frequency of the signal to be converted.

6. The method according to claim 1, wherein said selection means comprise two adders adapted to add said sum signal to square-wave signals which are respectively normal and inverted.

7. The method according to claim 6, wherein said selection means further comprise an additional pair of selectors adapted to add a DC offset to said signals in output from said pair of adders whereto said oscillator sends said square-wave signal whose frequency is twice said center frequency.

8. A device for converting a real signal into a complex signal, comprising a first adder adapted to add a signal to be converted and a signal whose frequency is four times the center frequency of said real signal to be converted, and further comprising:
   a selector adapted to select in-phase and quadrature components obtained from a sum signal which is provided in output by said first adder;
   threshold means adapted to remove components below a given threshold from said in-phase and quadrature components; and
   a multiplier adapted to multiply by +1 and −1 output signals from said threshold means.

9. The device according to claim 8, comprising an oscillator adapted to generate said signal whose frequency is four times said central frequency.

10. The device according to claim 8, comprising an additional oscillator adapted to generate a square-wave signal whose frequency is twice the frequency of said center frequency, said additional oscillator sending said square-wave signal to a selector which receives said sum signal from said first adder.

11. The device according to claim 9, comprising an oscillator adapted to generate a square-wave signal whose frequency is equal to said center frequency of said signal to be converted, said square-wave signal being sent into said multiplier for multiplication with said in phase and quadrature components.

12. The device according to claim 8, wherein said selector comprises a first pair of adders adapted to add to said sum signal a normal and inverted signal whose frequency is respectively twice said center frequency of said signal to be converted.

13. The device according to claim 12, wherein said selector comprises a second pair of adders adapted to add a DC offset to the signals in output from said first pair of adders.

* * * * *